United States Patent
Chung et al.

(10) Patent No.: US 8,764,960 B2
(45) Date of Patent: *Jul. 1, 2014

(54) MANUFACTURING METHODS FOR METAL CLAD LAMINATES

(75) Inventors: Kwang-Choon Chung, Gyeonggi-do (KR); Hyun-Nam Cho, Gyeonggi-do (KR); Seong-Yong Uhm, Gyeonggi-do (KR)

(73) Assignee: Inktec Co., Ltd. (KR)

( * ) Notice: Subject to any disclaimer, the term of this patent is extended or adjusted under 35 U.S.C. 154(b) by 1421 days.

This patent is subject to a terminal disclaimer.

(21) Appl. No.: 12/376,892

(22) PCT Filed: Aug. 2, 2007

(86) PCT No.: PCT/KR2007/003737
§ 371 (c)(1),
(2), (4) Date: Jun. 21, 2010

(87) PCT Pub. No.: WO2008/018719
PCT Pub. Date: Feb. 14, 2008

(65) Prior Publication Data
US 2010/0261031 A1    Oct. 14, 2010

(30) Foreign Application Priority Data

Aug. 7, 2006   (KR) .................. 10-2006-0074311
Aug. 7, 2006   (KR) .................. 10-2006-0074388

(51) Int. Cl.
*C23C 28/02*   (2006.01)
*C25D 5/02*    (2006.01)

(52) U.S. Cl.
USPC ................. 205/184; 205/136; 205/187

(58) Field of Classification Search
USPC .......................................... 205/136
See application file for complete search history.

(56) References Cited

U.S. PATENT DOCUMENTS

| 4,364,802 | A | * | 12/1982 | Inoue ........................... 205/104 |
| 4,542,214 | A |   | 9/1985  | Bechara |
| 4,995,908 | A | * | 2/1991  | Buchwald et al. ......... 106/38.22 |
| 5,494,943 | A | * | 2/1996  | Mahoney et al. ............. 522/66 |

(Continued)

FOREIGN PATENT DOCUMENTS

| JP | 53134759 | 11/1978 |
| JP | 53137078 | 11/1978 |

(Continued)

OTHER PUBLICATIONS

Agentine Office Action—AG Application No. P070103478 issued Sep. 2, 2010, citing US6,387,542, US2002/0094449, JP2004-335353 and JP2005-101398.

(Continued)

*Primary Examiner* — Keith Hendricks
*Assistant Examiner* — Stefanie Sherrill
(74) *Attorney, Agent, or Firm* — Cantor Colburn LLP

(57) ABSTRACT

The present invention relates to the manufacturing method of metal clad laminates by forming a conductive layer on a single side or both sides of a material film that is made of an insulating material using the silver complexes having a unique structure and electroplating metals outside of said conductive layer. The present invention can provide the manufacturing method of metal clad laminates, which has a fast operation speed for mass production, simple process steps to minimize defective ratio and cheap production cost.

28 Claims, 9 Drawing Sheets

(56) References Cited

U.S. PATENT DOCUMENTS

| | | | | |
|---|---|---|---|---|
| 6,111,685 | A * | 8/2000 | Tench et al. | 359/267 |
| 6,387,542 | B1 | 5/2002 | Kozlov et al. | |
| 7,955,528 | B2 * | 6/2011 | Chung et al. | 252/512 |
| 8,226,755 | B2 * | 7/2012 | Chung et al. | 106/1.19 |
| 8,252,382 | B2 * | 8/2012 | Chung et al. | 427/402 |
| 2002/0094449 | A1 | 7/2002 | Takeuchi et al. | |
| 2004/0043691 | A1 | 3/2004 | Abe et al. | |
| 2005/0123621 | A1 * | 6/2005 | Burton et al. | 424/618 |
| 2006/0062978 | A1 | 3/2006 | Yotsuya et al. | |

FOREIGN PATENT DOCUMENTS

| | | |
|---|---|---|
| JP | 60243277 | 12/1985 |
| JP | 8-162734 | 6/1996 |
| JP | 2003-502507 | 1/2003 |
| JP | 2003-509586 | 3/2003 |
| JP | 2004502871 | 1/2004 |
| JP | 2004-335353 | 11/2004 |
| JP | 2005-101398 | 4/2005 |
| JP | 2005294657 | 10/2005 |
| KR | 10-2005-0061285 | 6/2005 |
| KR | 10-2006-0090180 | 8/2006 |

OTHER PUBLICATIONS

International Search Report—PCT/KR2007/003737 dated Oct. 30, 2007.

Japanese Office Action—Japanese Application No. 2009-523712 issued on Sep. 27, 2011, citing JP60-243277, JP2004-502871, JP53134759, JP2005-294657 and JP53-137078.

* cited by examiner

MANUFACTURING METHODS FOR METAL CLAD LAMINATES

TECHNICAL FIELD

The present invention relates to manufacturing methods of metal clad laminates by forming a conductive layer on a single side or both sides of a material film that is made of an insulating material using the silver coating composition comprising silver complexes having a unique structure and electroplating metals outside of said conductive layer. Also, the present invention relates to the manufacturing methods of metal clad laminates, which form a conductive pattern layer by printing the silver coating composition directly on the materials when forming said conductive layer and produce a low-resistance metal pattern layer by electroplating metals outside of said conductive pattern layer.

BACKGROUND ART

As the whole industry and technology have been rapidly grown in recent years, semiconductor integrated circuits have been remarkably developed in general fields including cellular phones, MP3, displays, etc. Also, the growth of surface mounter technology which directly loads small chip components and small-form-factor electronic products is getting faster and faster. Thus, soft circuit substrates are now used more often than hard ones for minimization and flexibility of products. Due to the recent importance of printing circuit substrate, metal clad laminates such as copper clad laminates are manufactured in various ways and used widely.

The usual method to fabricate metal clad laminates, which are industrial laminates of soft circuit substrates, is to laminate with insulating base film by applying various adhesives on the metal sheet. For instance, Japanese Laid-Open Patent Publication No. PYUNG 8-162734 (Jun. 21, 1996) discloses the manufacturing method of three-layered metal clad laminates using thermoplastic Polyimide as the adhesive. Yet, it has a disadvantage that the laminates become thicker and less flexible since the bonded layer is more than 10 μm and show poor performance at high temperature just as solder, because the glass transition temperature of the adhesive is lower than 300° C.

Another existing technology to fabricate two-layered metal clad laminates is to coat a polyamic acid type resin on metal sheets and heat-treat at higher than 300° C. to produce polyimide dielectric films. But, there are a few problems that a big quantity of moisture is lost during the heat treatment and the volume contracts, causing the whole substrates get bent and curled up and dropping the adhesive power between the metal and insulating layers.

Japanese Patent Publication No. 2003-509586 (Mar. 11, 2003) discloses a manufacturing method of metal clad laminates by depositing more than one kind of metals such as Ni, Cu, Ti, Mo, Cr, etc. on insulting polyimide film through sputtering to form primary interface and then fabricate metal clad laminates by electroplating. In this case, uncurled products can be obtained since there is no decrease in volume in polyimide layer and the thickness of metal layers can be controlled depending on the plating condition. Yet, the sputtering process before electroplating is performed in a vacuum, making continuous process hard, manufacturing slow, and price going high.

On the other hand, as the size of flat panel displays such as plasma display panel (PDP), liquid crystal display (LCD), organic and inorganic electro luminescent display (ELD), etc. is getting broader and high resolution and high quality are needed, the length of metal patterns on circuit substrates has been remarkably increased, and resistance and capacitance value of wiring have extremely increased, too. Accordingly, the operation speed of displays slows down and distortion appears. Due to such problems, the development of process and materials to form low-resistance metal patterns is regarded as essential technology.

The general method to fabricate metal patterns is metal deposition or sputtering or to spin coat the ink including metals and laminate metals, then form desirable patterns after the photo resist process through exposure and development and then indirectly produce them by etching. Yet, the above method has a few problems that it is a complicated process, an improper way to produce multi-layered patterns, and there is also limitation in development of vacuum deposition equipment for maximizing the size of substrates.

US patent No. 2006-0062978 discloses a method to directly fabricate a pattern by adhering a pattern-formed mask onto substrates such as silicon wafer and forming metals by sputtering, but this reduces fabrication ability due to long sputtering time to satisfy low resistance. Korean patent No. 2005-0061285 discloses a manufacturing method of metal pattern by plating desirable metals after forming potential patterns using photocatalytic compounds on the substrates, but it also has disadvantages that the activation time of potential patterns are short and there are high defective proportions due to the continuous process.

Japanese Laid-Open Patent Publication No. 2003-502507 discloses a fabrication method of metal patterns by electroless plating after forming catalytic pattern layers, which are pressed through a micro stamp on the surface of the substrates, but it is hard to form uniform lines.

US patent No. 2004-043691 discloses a direct formation method of metal ink patterns through inkjet printing, but it is hard to form metal patterns with high resolution and low resistance and its manufacturing speed is slow.

Japanese Patent Publication No. 2002-511643 discloses a plating method of printing patterns on the substrates. The above patterns are printed using polymer materials having conductive particles, which is well-known art. Yet, it is hard to print thin and uniform patterns with existing technology and the said patent does not provide specific solutions for pattern printing methods.

DISCLOSURE OF INVENTION

Technical Subject

To solve such problems, the present inventors came up with the present invention after successive experiments.

The present invention provides the manufacturing methods of metal clad laminates by forming a conductive layer on a single side or both sides of a material film that is made of an insulating material using the silver complexes having a unique structure and electroplating metals outside of said conductive layer. Also, the present invention provides the manufacturing methods of metal clad laminates, which form a conductive pattern layer by printing the silver coating composition comprising silver complexes having a unique structure directly on materials when forming said conductive layer and produce a low-resistance metal pattern layer.

Moreover, the present invention provides the manufacturing methods of metal clad laminates, which has a fast operation speed for mass production, simple process steps to minimize defective ratio and cheap production cost.

Technical Solution

The present invention relates to the manufacturing methods of metal clad laminates by forming a conductive layer on a single side or both sides of a material film that is made of an insulating material using the silver coating composition comprising silver complexes having a unique structure and electroplating metals outside of said conductive layer. Hereinafter, the present invention is described in more detail.

As shown in FIG. 1, the metal clad laminate fabricated by the present invention is composed of an insulating material (11), a conductive layer (12) formed by coating the silver coating composition, and a metal-plated layer (13) formed by electroplating. FIG. 5 shows the metal clad laminate according to another example of the present invention. As shown in FIG. 5, the metal clad laminate having metal pattern layers is composed of a conductive layer (52) formed by printing the silver coating composition on the insulating material (51) and a metal-plated layer (53) formed by electroplating on the outer surface of the above conductive layer.

The manufacturing method of the above metal clad laminate comprises the steps of:

(i) forming a conductive layer by applying the silver coating composition on a single side or both sides of insulating materials; and (ii) forming a metal-plated layer by electroplating metals on the above conductive layer.

Also, for the present invention, the process inducing hydrophilicity can be used if necessary, through plasma treatment by inducing argon, oxygen, and nitrogen respectively or mixed gas of argon and oxygen; argon and nitrogen; or nitrogen and oxygen, so that it can improve adhesive power between the insulating materials and conductive layers.

Step (i):

It is a step where a conductive layer is formed by applying silver coating composition on a single side or both sides of insulating materials (11).

The insulating materials used here are polyimide(PI), polyethyleneterephthalate (PET), polyethylenenaphthalate (PEN), polyethersulfone (PES), nylon, polytetrafluoroethylene (PTFE), polyetheretherketone (PEEK), polycarbonate (PC), polyarylate (PA), etc. For the insulating materials, those that have gone through plasma treatment or adhesive primer treatment on a single side or both sides can be used, but they are not limited to only those kinds.

The silver coating compositions for forming a conductive layer (12) comprise the silver complexes that are obtained by the reaction between the silver compound (Formula 1), ammonium carbamate (Formula 2), ammonium carbonate (Formula 3), ammonium bicarbonate (Formula 4) or their mixture.

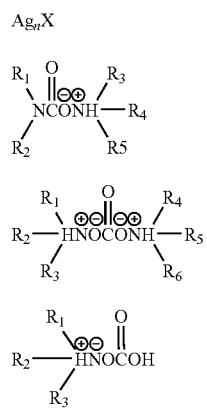

[Formula 1] $Ag_nX$

[Formula 2]

[Formula 3]

[Formula 4]

[In the formula above,

X is a substituted group selected from the group consisting of oxygen, sulfur, halogen, cyano, cyanate, carbonate, nitrate, nitrite, sulfate, phosphate, thiocyanate, chlorate, perchlorate, tetrafluoro borate, acetylacetonate, carboxylate and their derivatives, n is an integer of 1~4, $R_1$ to $R_6$ are substituted groups independently selected from the group consisting of hydrogen, C1-C30 of aliphatic or cycloaliphatic alkyl group or aryl or aralkyl group, alkyl and aryl group substituted with functional group, heterocyclic compound, polymer compound and their derivatives, ($R_1$ and $R_2$) or ($R_4$ and $R_5$) can form a ring by being connected with alkylene independently comprising hetero atom or not.]

In the formula 1 above, n is an integer of 1~4, X is a substituted group selected from the group consisting of oxygen, sulfur, halogen, cyano, cyanate, carbonate, nitrate, nitrite, sulfate, phosphate, thiocyanate, chlorate, perchlorate, tetrafluoro borate, acetylacetonate, carboxylate and their derivatives, for example, silver oxide, silver thiocyanate, silver sulfide, silver chloride, silver cyanide, silver cyanate, silver carbonate, silver nitrate, silver nitrite, silver sulfate, silver phosphate, silver perchlorate, silver tetrafluoro borate, silver acetylacetonate, silver carboxylate, silver lactate, silver oxalate and their derivatives, but it is not specially defined to the compounds above.

And, $R_1$ to $R_6$ can be selected from the group consisting of hydrogen, methyl, ethyl, propyl, isopropyl, butyl, isobutyl, amyl, hexyl, ethylhexyl, heptyl, octyl, isooctyl, nonyl, decyl, dodecyl, hexadecyl, octadecyl, docodecyl, cyclopropyl, cyclopentyl, cyclohexyl, allyl, hydroxy, methoxy, hydroxyethyl, methoxyethyl, 2-hydroxy propyl, methoxypropyl, cyanoethyl, ethoxy, buthoxy, hexyloxy, methoxyethoxyethyl, methoxyethoxyethoxyethyl, hexamethyleneimine, morpholine, piperidine, piperazine, ethylenediamine, propylenediamine, hexamethylenediamine, triethylenediamine, pyrrol, imidazol, pyridine, carboxymethyl, trimethoxysilylpropyl, triethoxysilylpropyl, phenyl, methoxyphenyl, cyanophenyl, phenoxy, tolyl, benzyl and their derivatives, and polymer compounds such as polyallylamine or polyethyleneimine and their derivatives, but it is not specially defined to the compounds above.

As the concrete ammonium carbamate compounds (Formula 2), for example, they are one or more than two mixture selected from the group consisting of ammonium carbamate, ethylammonium ethylcarbamate, isopropylammonium isopropylcarbamate, n-butylammonium n-butylcarbamate, isobutylammonium isobutylcarbamate, t-butylammonium t-butylcarbamate, 2-ethylhexylammonium 2-ethylhexylcarbamate, octadecylammonium octadecylcarbamate, 2-methoxyethylammonium 2-methoxyethylcarbamate, 2-cyanoethylammonium 2-cyanoethylcarbamate, dibutylammonium dibutylcarbamate, dioctadecylammonium dioctadecylcarbamate, methyldecylammonium methyldecylcarbamate, hexamethyleneimineammonium hexamethyleneiminecarbamate, morpholinium morpholinecarbamate, pyridinium ethylhexylcarbamate, triethylenediaminium isopropylbicarbamate, benzylammonium benzylcarbamate, triethoxysilylpropylammonium triethoxysilylpropylcarbamate and their derivatives. As the concrete ammonium carbonate compounds (Formula 3), for example, they are one or more than two mixture selected from the group consisting of ammonium carbonate, ethylammonium ethylcarbonate, isopropylammonium isopropylcarbonate, n-butylammonium n-butylcarbonate, isobutylammonium isobutylcarbonate, t-butylammonium t-butylcarbonate, 2-ethylhexylammonium 2-ethylhexylcarbonate, 2-methoxyethylammonium 2-methoxyethylcarbonate, 2-cyanoethylammonium 2-cyanoethylcarbonate, octadecylammonium octadecylcarbonate, dibutylammonium dibutylcarbonate, dioctadecylammonium dioctadecylcarbonate, methyldecylammonium methyldecylcarbonate, hexamethyleneimineammonium hexamethyleneiminecarbonate, morpholineammonium morpholinecarbonate, benzylammonium benzylcarbonate, triethoxysilylpropylammonium triethoxysilylpropylcarbonate, triethylenediaminium isopropylcarbonate and their derivatives. As the concrete ammonium bicarbonate compounds (Formula 4), for example, they are one or more than two mixture selected from the group consisting of ammonium bicarbonate, isopropylammonium bicarbonate, t-butylammonium bicarbonate, 2-ethylhexylammonium bicarbonate, 2-methoxyethylammonium bicarbonate, 2-cyanoethylammonium bicarbonate, dioctadecylammonium bicarbonate, pyridinium bicarbonate, triethylenediaminium bicarbonate and their derivatives.

On the other hand, it doesn't necessarily have to restrict the kind of ammonium carbamate, ammonium carbonate or ammonium bicarbonate based compounds and their manufacturing methods. For example, U.S. Pat. No. 4,542,214 (Sep. 17, 1985) discloses that ammonium carbamate based compounds can be prepared from primary amine, secondary amine, tertiary amine or at least more than one of these compounds and carbon dioxide. Ammonium carbonate based compounds can be obtained if 0.5 mole of water is added per one mole of amine, and ammonium bicarbonate based compounds can be obtained if more than one mole of water is added. In case they are made with or without any specific solvent in the condition of pressure or ambient pressure, the followings are to be used: water, alcohols such as methanol, ethanol, isopropanol and butanol, glycols such as ethyleneglycol and glycerine, acetates such as ethyl acetate, butyl acetate and carbitol acetate, ethers such as diethyl ether, tetrahydrofuran and dioxane, ketones such as methyl ethyl ketone and acetone, hydrocarbons such as hexane and heptane, aromatic hydrocarbons such as benzene and toluene, halogen substituted solvents such as chloroform, methylene chloride and carbontetrachloride, or mixed solvents of the above. As for carbon dioxide, it can be used as bubbled ones in the vapor phase or as solid dry ices. It can react in the supercritical condition, too. To prepare ammonium carbamate, ammonium carbonate or ammonium bicarbonate derivatives that are used in the present invention, it is fine to use any methods including the above ones, if the final material structure is identical. In other words, it doesn't necessarily have to put restrictions on solvents, reaction temperature, concentration, catalyst, etc. for preparation and its yield.

Organic silver complexes can be manufactured by reaction between ammonium carbamate, ammonium carbonate or ammonium bicarbonate based compounds and silver compounds. For instance, the preparation takes at least more than one silver compound as shown in Formula 1 and compounds as shown in Formula 2 to 4 or the complex of these, which react by themselves without solvents in the nitrogen condition of pressure or ambient pressure. In case solvents are used, the followings can be used: water, alcohols such as methanol, ethanol, isopropanol and butanol, glycols such as ethyleneglycol and glycerine, acetates such as ethyl acetate, butyl acetate and carbitol acetate, ethers such as diethyl ether, tetrahydrofuran and dioxane, ketones such as methyl ethyl ketone and acetone, hydrocarbons such as hexane and heptane, aromatic compounds such as benzene and toluene, and halogen substituted solvents such as chloroform, methylene chloride, carbontetrachloride, or mixed solvents of the above.

The manufacturing method of the silver complexes according to the present invention is disclosed in Korean Patent Application No. 2006-0011083 by the inventors of the present invention. It has the structure of Formula 5 below.

$Ag[A]_m$ [Formula 5]

[A is the compound of Formula 2 to 4, and m ranges in 0.7-2.5.]

The silver coating composition used to prepare conductive materials includes the silver complex above. The coating composition of the present invention may include additives such as solvents, stabilizers, leveling agents, and film assistants, if necessary.

As for stabilizers, for instance there are amine compounds such as primary amine, secondary amine, and tertiary amine; ammonium carbamate, ammonium carbonate, and ammonium bicarbonate based compounds; phosphorus compounds such as phosphine, phosphite, and phosphate; sulfur compounds including thiol and sulfide. They consist of these compounds or mixture of them. As the concrete amine compounds, for example, they are selected from the group consisting of methyl amine, ethyl amine, n-propyl amine, isopropyl amine, n-butyl amine, isobutyl amine, isoamyl amine, n-hexyl amine, 2-ethylhexyl amine, n-heptyl amine, n-octyl amine, isooctyl amine, nonyl amine, decyl amine, dodecyl amine, hexadecyl amine, octadecyl amine, docodecyl amine, cyclopropyl amine, cyclopentyl amine, cyclohexyl amine, allyl amine, hydroxy amine, ammonium hydroxide, methoxy amine, 2-ethanolamine, methoxyethyl amine, 2-hydroxypropyl amine, 2-hydroxy-2-methylpropyl amine, methoxypropyl amine, cyanoethyl amine, ethoxy amine, n-buthoxy amine, 2-hexyloxy amine, methoxyethoxyethyl amine, methoxyethoxyethoxyethyl amine, diethyl amine, dipropyl amine, diethanolamine, hexamethyleneimine, morpholine, piperidine, piperazine, ethylenediamine, propylenediamine, hexamethylenediamine, triethylenediamine, 2,2-(ethylenedioxy)bisethyl amine, triethyl amine, triethanolamine, pyrrol, imidazol, pyridine, aminoacetaldehyde dimethyl acetal, 3-aminopropyltrimethoxy silane, 3-aminopropyltriethoxy silane, aniline, anisidine, aminobenzonitrile, benzyl amine and their derivatives, and polymer compounds such as polyallylamine or polyethyleneimine and their derivatives.

As the concrete compounds, for example, ammonium carbamate based compounds are selected from the group consisting of ammonium carbamate, ethylammonium ethylcarbamate, isopropylammonium isopropylcarbamate, n-butylammonium n-butylcarbamate, isobutylammonium isobutylcarbamate, t-butylammonium t-butylcarbamate, 2-ethylhexylammonium 2-ethylhexylcarbamate, octadecylammonium octadecylcarbamate, 2-methoxyethylammonium 2-methoxyethylcarbamate, 2-cyanoethylammonium 2-cyanoethylcarbamate, dibutylammonium dibutylcarbamate, dioctadecylammonium dioctadecylcarbamate, methyldecylammonium methyldecylcarbamate, hexamethyleneimineammonium hexamethyleneiminecarbamate, morpholinium morpholinecarbamate, pyridinium ethylhexylcarbamate, triethylenediaminium isopropylbicarbamate, benzylammonium benzylcarbamate, triethoxysilylpropylammonium triethoxysilylpropylcarbamate and their derivatives. The ammonium carbonate based compounds are selected from the group consisting of ammonium carbonate, ethylammonium ethylcarbonate, isopropylammonium isopropylcarbonate, n-butylammonium n-butylcarbonate, isobutylammonium isobutylcarbonate, t-butylammonium t-butylcarbonate, 2-ethylhexylammonium 2-ethylhexylcarbonate, 2-methoxyethylammonium 2-methoxyethylcarbonate, 2-cyanoethylammonium 2-cyanoethylcarbonate, octadecylammonium octadecylcarbonate, dibutylammonium dibutylcarbonate, dioctadecylammonium dioctadecylcarbonate, methyldecylammonium methyldecylcarbonate, hexamethyleneimineammonium hexamethyleneiminecarbonate, morpholineammonium morpholinecarbonate, benzylammonium benzylcarbonate, triethoxysilylpropylammonium triethoxysilylpropylcarbonate, triethylenediaminium isopropylcarbonate and their derivatives. The ammonium bicarbonate based compounds are selected from the group consisting of ammonium bicarbonate, isopropylammonium bicarbonate, t-butylammonium bicarbonate, 2-ethylhexylammonium cyanoethylammonium bicarbonate, dioctadecylammonium bicarbonate, pyridinium bicarbonate, triethylenediaminium bicarbonate and their derivatives.

Also, phosphorus compounds are represented as Formula $R_3P$, $(RO)_3P$, or $(RO)_3PO$, where 'R' indicates alkyl or aryl group of carbon number 1~20, and the examples are tributyl phosphine, triphenyl phosphine, triethyl phosphite, triphenyl phosphite, dibenzyl phosphate, triethyl phosphate, etc. For sulfur compounds, there are butan thiol, n-hexanethiol, diethyl sulfide, tetrahydrothiophene, allyl disulfide, 2-mercaptobenzoazole, tetrahydrothiophene, octylthioglycolate, etc. The amount of stabilizer usage is not limited once it is suited for the silver coating composition property of the present invention. Yet, it is good to have a mole ratio of 0.1%~90% to silver compounds, more preferably, 1%~50%. When the amount of stabilizer exceeds said range, the conductivity of film may be decreased. When the amount of stabilizer is less than said range, the storing stability of silver coating composition may be reduced. Also, for film assistants, organic acid and organic acid derivatives can be used and they are composed of mixture of more than at least one component. The examples of organic acid are acetic acid, butyric acid, valeric acid, pivalic acid, hexanoic acid, octanoic acid, 2-ethyl-hexanoic acid, neodecanoic acid, lauric acid, stearic acid, naphthalic acid, oleic acid, linolenic acid etc. For organic acid derivatives, there are organic acid ammonium salt such as ammonium acetate, ammonium citrate, ammonium laurate, ammonium lactate, ammonium maleate, ammonium oxalate, and ammonium molibdate; organic acid metal salts such as manganese oxalate, gold acetate, palladium oxalate, silver 2-ethyl hexanoate, silver octanoate, silver neodecanoate, cobalt stearate, nickel naphthalate, and cobalt naphthalate, which include such metals as Au, Cu, Zn, Ni, Co, Pd, Pt, Ti, V, Mn, Fe, Cr, Zr, Nb, Mo, W, Ru, Cd, Ta, Re, Os, Ir, Al, Ga, Ge, In, Sn, Sb, Pb, Bi, Sm, Eu, Ac, Th, etc. The usage amount of film assistants is not limited, but it is good to have a mole ratio of 0.1%~25% to silver complexes. When the amount of film assistant exceeds said range, the formation of uniform film is difficult. When the amount of film assistant is less than said range, the film may have a crack.

And, solvents may be sometimes needed to control the viscosity of silver coating composition or to help make thin film. The usable solvents can be selected from the group consisting of water, alcohols such as methanol, ethanol, isopropanol, 1-methoxypropanol, butanol, ethylhexyl alcohol, and terpineol, glycols such as ethyleneglycol and glycerine, acetates such as ethyl acetate, butyl acetate, methoxypropyl acetate, carbitol acetate, and ethylcarbitol acetate, ethers such as methyl cellosolve, butyl cellosolve, diethyl ether, tetrahydrofuran and dioxane, ketones such as methyl ethyl ketone, acetone, dimethylformamide, and 1-methyl-2-pyrrolidone, hydrocarbons such as hexane, heptane, dodecane, paraffin oil, and mineral spirits, aromatic hydrocarbons such as benzene, toluene, and xylene, halogen substituted solvents such as chloroform, methylene chloride and carbontetrachloride, acetonitrile, dimethylsulfoxide or mixed solvents of the above.

As for the coating methods which coat said silver coating composition on the materials, any methods can be used including brushing, spray coating, dip coating, roll coating, spin coating, inkjet printing, offset printing, screen printing, pad printing, Gravure printing, Flexo printing, Imprinting or Riso printing, etc. And, the coating method is selected depending on the material's form and quality. In consideration of production efficiency and work quality, roll coating, which coats the entire materials uniformly, is preferable. As for the methods forming conductive pattern layer by printing the silver coating composition on the materials directly, spin coating, inkjet printing, offset printing, screen printing, pad printing, Gravure printing, Flexo printing, Imprinting or Riso printing, etc. can be used. Further, in consideration of production efficiency, work quality and printing resolution, Gravure printing or offset printing is more preferable.

Also, binder resins can be used to improve adhesive power between silver coating composition and the materials. The binder resins used here are acrylic resins such as polyacrylic acid or polyacrylic acid ester; cellulose based resins such as ethyl cellulose, cellulose ester, and cellulose nitrate; aliphatic or copolymer polyester based resins; vinyl based resins such as polyvinylbutyral, polyvinylacetate, polyvinylpyrrolidone; polyamide resins; polyurethane resins; polyether and urea resins; alkyd resins; silicone resins; fluoride resins; olefin based resins such as polyethylene or polystyrene; thermoplastic resins such as petroleum and rosin based resins; epoxy based resins; unsaturated or vinyl polyester based resins; diallylphthalate based resins; phenol based resins; oxetane based resins; oxazine based resins; bismaleimide based resins; modified silicone resins such as silicone epoxy or silicone polyester; thermosetting resins such as melamine based resin; acryl based resins with various structures of UV or electron-beam curing; natural polymer such as ethylene-propylene rubber (EPR), styrene-butadiene rubber (SBR), starch, and gelatin. One or more of these can be chosen and used together. Also, there can be not only organic resin binders but also inorganic binders such as glass resins or glass frit; silane coupling agents such as trimethoxy propyl silane or vinyl triethoxy silane; titanium, zirconium or aluminum based coupling agents.

Thus, after the silver coating composition is coated or printed on the materials, a conductive layer can be formed through after-treatment process, whose examples are oxidation or reduction treatment; heat treatment; infrared ray; ultraviolet; electronic ray; laser; etc. In case silver coating composition is printed directly on the materials, the above conductive layer is formed into a conductive pattern layer.

For the after-treatment above, heat treatment can be performed under the usual inert condition, but can be also done in air, nitrogen, or carbon monoxide respectively; hydrogen and air; or other inert gases. The usual temperature for heat treatment is at 80~400° C., preferably at 90~300° C., and more preferably at 100~250° C. Additionally, more than two steps of heat treatment at both high and low temperature within the range of the above temperatures help film being uniform. For instance, it is good that the treatment is performed at 80~150° C. for 1~30 minutes and then at 150~300° C. for 1~30 minutes.

Then, the thickness of a conductive layer is 0.005~5 μm, preferably 0.01~1 μm, and more preferably 0.05~0.5 μm. When it is more than 0.005 μm, there is a disadvantage that the production cost increases. When it is less than 5 μm, uniform film cannot be formed, so the metal-plated layer might not be uniform either when electroplating.

Also, the conductivity of a conductive layer is 10 mΩ~1 kΩ/□, preferably 50 mΩ~10 Ω/° C., and more preferably 100 mΩ~1 Ω/° C. When it exceeds 1 Ω/° C., conductivity drops, which can cause defective ones when plating. When it is lower than 10 mΩ/° C., the production cost increases.

Step (ii):

It is a step where a metal-plated layer is formed after electroplating on the conductive layer prepared in Step (i).

In this step, the material film, where a conductive layer is formed through silver coating, is applied for electroplating, and then the electroplated metals are laminated on the silver conductive layer to obtain the metal clad laminate. The thickness of a metal-plated layer should be 1~50 μm. When it is less than 1 μm, pinholes could appear on the metal clad laminates and when it exceeds 50 μm, the precision of line width might deteriorate in high density metal lines.

The desirable materials for the metal layer created by the above electroplating are conductive metals such as copper, aluminum, nickel, silver, gold, and chrome or alloys of these.

FIG. 2 shows a flow chart representing one example of the manufacturing methods of the metal clad laminates by the present invention.

The base film (22) reeled in film roll (21) goes through the transfer roll (23a) to the coating roll (24), covering and coating the silver coating composition. The coating roll (24) plays a roll in uniformly coating the silver coating composition on the base film (22). The thickness of the conductive silver layer can be controlled depending on the finish of the coating roll and the concentration of the silver coating composition.

The film where the conductive silver layer is now formed through the coating roll is transferred to the kiln (25). The kiln (25) plays a roll in performing plastic heat treatment for the silver coating composition that is coated on the base film (22).

The base film (22) now having conductivity goes through the transfer roll (23b) to metal plating process, then electroplating in the plating bath (27). When the silver coated surface is connected to cathode (26b) and the metal to be plated in electrolyte to anode (26c), with the current supplied through the rectifier (26a), the metal on the silver layer becomes electroplated. Then, after being transferred through the transfer roll (23d) to the water bath (28) and going through the transfer roll (23f) to the dryer (29) for drying its moisture, the metal clad laminate is obtained, which is reeled again in the rewinding roll (30).

The flow chart shown in FIG. 2 is no more than an example of the continuous process of the present invention. A single process including the two steps (i) and (ii) described above or other various processes including these two can be freely changed.

FIG. 6 shows a flow chart representing one example of the manufacturing method of metal clad laminates, where a low-resistance metal pattern layer is formed, according to the present invention. Yet, the flow chart shown in FIG. 6 is no more than an example of the present invention and is not limited by the present invention.

The material film (22) reeled in film roll (21) goes through the transfer roll (23a) to the printing roll (31), covering and printing the silver coating composition. The printing roll (31) plays a roll in uniformly coating the silver coating composition on the material film (22). The thickness and line width of the conductive silver pattern layer can be controlled depending on the finish of the printing roll and the concentration of the silver coating composition. The material film where conductive pattern is now printed through the printing roll is transferred to the kiln (25). The silver coating composition printed on the material film (22) is plastic heat treated to form a conductive pattern layer. The conductive pattern layer formed on the material film as above works as cathode (71) and forms a metal-plated layer by contacting the plating cartridge. Then, after being transferred through the transfer roll (23d) to the water bath (28) and going through the transfer roll (23f) to the dryer (29) for drying its moisture, the film with a metal pattern layer is obtained, which is reeled again in the rewinding roll (30).

FIG. 7 shows a cross-sectional view of plating cartridge (70) for electroplating of the present invention.

As in FIG. 7, the cathode (71a, 71b) of the plating cartridge (70) plays a roll in contacting conductive patterns. For flexibility improvement, flexible plates (78) such as rubber and silicone are used as the material of inside of the cathode (71a, 71b). The inside of the plating cartridge (70) is filled with sponge (73), which has great hygroscopic. The sponge (73) is made to contact the anode (72) and cathode (71a, 71b) and its inside contains an electrode bar (79) that is used as anode (72). Inside of this electrode bar (79), there is an oscillator (75) that helps the plating solution flowing to the cathode (71a, 71b), which contacts the conductive pattern of the materials, by oscillating. Between the oscillator (75) and the electrode bar (79), there is an insulating layer to prohibit welding current. Also, in the upper part, the plating solution storage (77) is located to keep plating solution, which is transferred by a pump (76). Plating is performed when the electroplating solution contacts the conductive pattern by the oscillator (75).

EXPLANATION OF SYMBOLS FOR MAIN PART OF THE FIGURES

| | |
|---|---|
| 11, 51: material | 12, 52: conductive layer |
| 13, 53: metal-plated layer | 21: film roll |
| 22: material film | 23a~23f: transfer roll |
| 24: coating roll | 25: kiln |
| 26: electricity supplier | 26a: rectifier |
| 26b: cathode | 26c: anode |
| 27: plating bath | 28: water bath |

-continued

| 29: dryer | 30: rewinding roll |
| 31: printing roll | 70: plating cartridge |
| 71a, 71b: cathode | 72: anode |
| 73: sponge | 74: insulating layer |
| 75: oscillator | 76: pump |
| 77: plating solution storage | 78: plate |
| 79: electrode bar | |

BEST MODE FOR CARRYING OUT THE INVENTION

Hereinafter, the present invention is described in more detail based on the following examples.

Example 1

Figure 1:
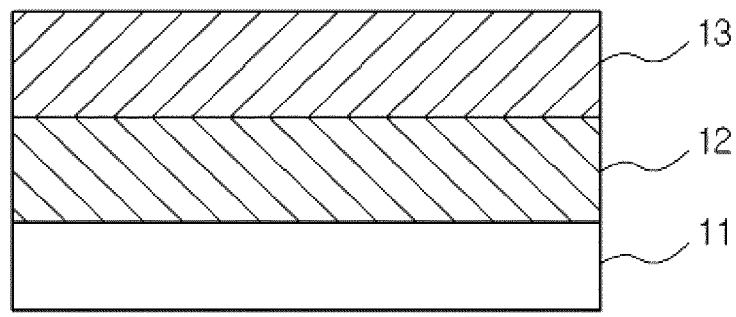
FIG. 1 is a cross-sectional view of metal clad laminate according to the present invention.
Figure 2:
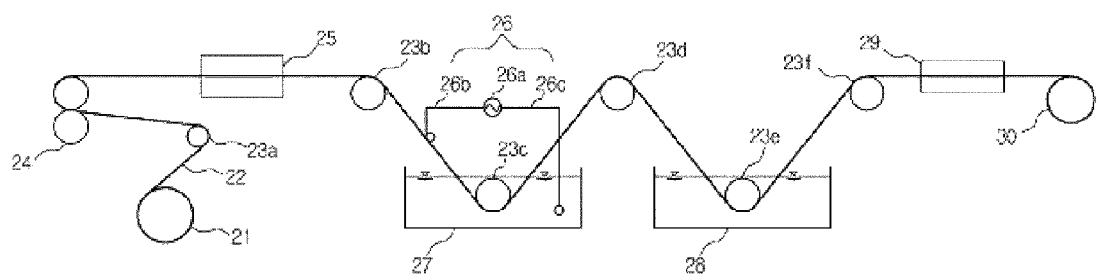
FIG. 2 is a flow chart representing one example of manufacturing method for metal clad laminate according to the present invention.
Figure 3:
FIG. 3 is a photo showing a conductive silver film formed according to Example 1 of the present invention.
Figure 4:
FIG. 4 is a photo showing a copper-plated metal clad laminate on a conductive silver film according to Example 1 of the present invention.

2-Ethylhexylammonium 2-ethylhexylcarbamate (1.53 kg, 5.08 mol) and n-butylammonium n-butylcarbamate (1.33 kg, 6.94 mol) were added to a reactor equipped with a stirrer and isopropanol (0.95 kg) was added to dissolve them. Silver oxide (1 kg, 4.31 mol) was then added to the reactor and the reaction was carried out at room temperature. The reaction initially occurred in black slurry of said reaction solution. However, according to the formation of a complex over time, it was observed that color of the reaction solution became lighter and eventually turned transparent. After 2 hours of the reaction, a colorless and transparent solution was obtained. To said solution, 1-amino-2-propanol (0.125 kg) and VAP MP 200 (0.12 kg; manufactured by Chokwang Paint, Ltd.), which is an acrylic resin, are added as a stabilizer and a binder resin, respectively. After stirring, the solution was filtered using a membrane filter having a pore size of 0.45 micron to give a silver coating composition. A polyimide (PI) film was coated with thus-obtained silver coating composition using a roll-to-roll coating machine. The film was then subjected to a heat treatment to give a silver film having a conductivity of 0.3 Ω/° C. and a thickness of 0.2 micron. The silver coated film obtained above was placed in a bath in which copper sulfate is comprised in a concentration of 125 g/L at 35° C. Having copper as an anode and a silver-coated side of the film as a cathode, an electric current (30 A/m$^2$) was applied while maintaining the travel speed of the film at 10 m/min to prepare a metal clad laminate having the copper foil layer with 10 micron thickness. Initial peel strength of the metal clad laminate as prepared as above is given in the following Table 1. Meanwhile, photograph images of the film to which a silver film is formed and the metal clad laminate to which copper foil is laminated are shown in FIG. 3 and FIG. 4, respectively.

Example 2

The silver coated film obtained in Example 1 was placed in a bath in which nickel sulfate (150 g/L), nickel chloride (40 g/L) and boric acid (30 g/L) are comprised at 30° C. Having nickel as an anode and a silver-coated side of the film as a cathode, an electric current (25 A/m$^2$) was applied while maintaining the travel speed of the film at 8 m/min to prepare a metal clad laminate having the copper foil layer with 5 micron thickness. Initial peel strength of the metal clad laminate as prepared as above is given in the following Table 1.

Example 3

A PET film was coated with the silver coating composition obtained in the above Example 1 using a roll-to-roll coating machine. The film was then subjected to a heat treatment to give a silver film having a conductivity of 0.3 Ω/° C. and a thickness of 0.2 micron. Thus-obtained conductive PET film was placed in a bath in which copper sulfate (125 g/L) is comprised at 35° C. Having copper as an anode and a silver-coated side of the film as a cathode, an electric current (30 A/m$^2$) was applied while maintaining the travel speed of the film at 10 m/min to prepare a metal clad laminate having the copper foil layer with 10 micron thickness. Initial peel strength of the resulting metal clad laminate is given in the following Table 1. The metal clad laminate as prepared as above was subjected to a photolithographic process to form a mesh pattern having line width of 10 micron and line interval of 300 micron.

Example 4

A nylon sheet was coated with the silver coating composition obtained in the above Example 1 using a roll-to-roll coating machine. The sheet was then subjected to a heat treatment to give a silver film having a conductivity of 0.75 Ω/° C. and a thickness of 0.08 micron. Thus-obtained conductive nylon sheet was placed in a bath in which copper sulfate (125 g/L) is comprised at 35□. Having copper as an anode and a silver-coated side of the film as a cathode, an electric current (30 A/m$^2$) was applied while maintaining the travel speed of the film at 10 m/min to prepare a metal clad laminate having the copper foil layer with 10 micron thickness. Initial peel strength of the metal clad laminate as prepared as above is given in the following Table 1.

TABLE 1

Peel strength of the metal clad laminates prepared in the Examples

| Example | Peel Strength (N/mm)[1] | | | Average Peel Strength |
| | 1st | 2nd | 3rd | |
| --- | --- | --- | --- | --- |
| 1 | 0.71 | 0.69 | 0.69 | 0.69 |
| 2 | 0.65 | 0.65 | 0.64 | 0.65 |
| 3 | 0.78 | 0.77 | 0.78 | 0.78 |
| 4 | 0.75 | 0.75 | 0.74 | 0.75 |

[1]Peel strength: Strength of a 10 mm sample which has been stored at room temperature for 24 hr after metal plating, wherein the strength of the sample is measured by peeling off the sample with a speed of 50 mm/min at 90 degree.

As it is shown in the results of Table 1 above, peel strength of the metal layer in the metal clad laminate is high, indicating that when a metal layer is formed onto a silver coated film by electroplating its adhesiveness to a base film is very strong.

Example 5

Figure 8:
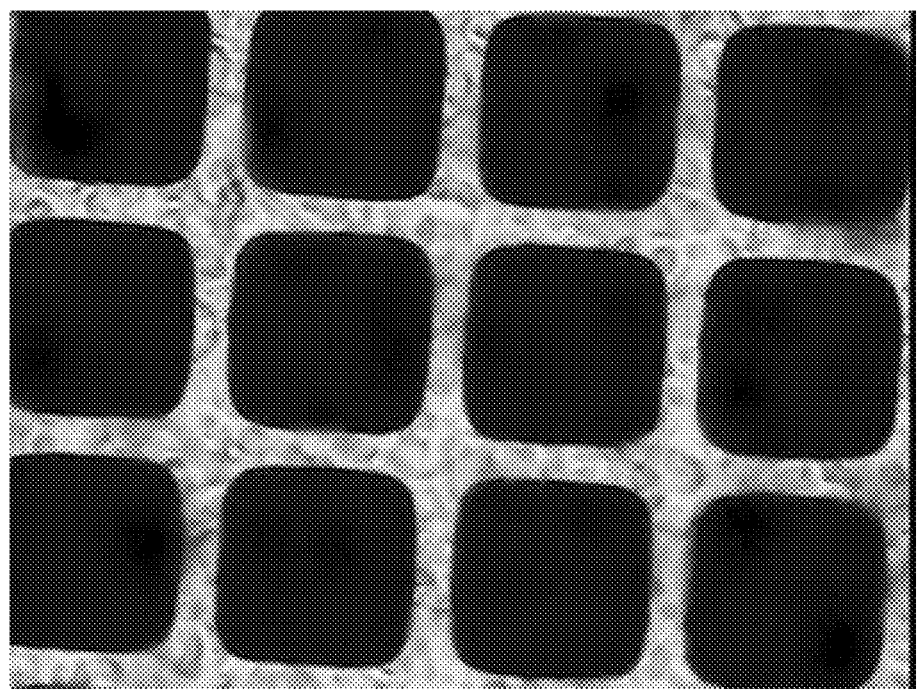
FIG. 8 is an electromagnetic wave filter prepared according to Example 5 of the present invention.

2-Ethylhexylammonium 2-ethylhexylcarbamate (1.53 kg, 5.08 mol) and n-butylammonium n-butylcarbamate (1.33 kg, 6.94 mol) were added to a reactor equipped with a stirrer and isopropanol (0.95 kg) was added to dissolve them. Silver oxide (1 kg, 4.31 mol) was then added to the reactor and the reaction was carried out at room temperature. The reaction initially occurred in black slurry of said reaction solution. However, according to the formation of a complex over time, it was observed that color of the reaction solution became lighter and eventually turned transparent. After 2 hours of the reaction, a colorless and transparent solution was obtained. To said solution, 1-amino-2-propanol (0.125 kg) and VAP MP 200 (0.12 kg; manufactured by Chokwang Paint, Ltd.), which is an acrylic resin, are added as a stabilizer and a binder resin, respectively. After stirring, the solution was filtered using a membrane filter having a pore size of 0.45 micron to give a silver coating composition with a viscosity of 120 cp. A PET film was printed with thus-obtained silver coating composition using a Gravure printer to obtain a mesh form with line width of 30 micron, line interval of 300 micron, and thickness of 0.15 micron. The film was then subjected to a heat treatment at 130° C. to obtain a pattern of electric wave shielding filter having conductivity. Thus-obtained pattern was brought into contact with a plating cartridge (70) for electroplating. An electrolytic solution, which comprises copper sulfate in 180 g/L concentration, was contained inside the plating cartridge. An electric current (500 A/m$^2$) was applied while running the system at 7 m/min of the film travel speed to prepare a low-resistance pattern to which copper is plated with thickness of 10 micron. Microscopic image of the resulting pattern is given in FIG. 8.

Example 6

A PET film was printed with the silver coating composition obtained in the Example 5 using a Gravure printer to obtain a mesh form with line width of 30 micron, and line interval of 300 micron. The film was then subjected to a heat treatment at 130° C. to obtain a transparent pattern having electric conductivity. Thus-obtained pattern was brought into contact with a plating cartridge (70) for electroplating nickel. An electrolytic solution with concentration of 120 g/L, in which nickel sulfate (150 g/L), nickel chloride (40 g/L) and boric acid (30 g/L) are included, was contained inside the plating cartridge. An electric current (500 A/m$^2$) was applied while running the system at 5 m/min of the film travel speed to prepare a low-resistance pattern to which nickel is plated with thickness of 7 micron.

Example 7

Figure 5:
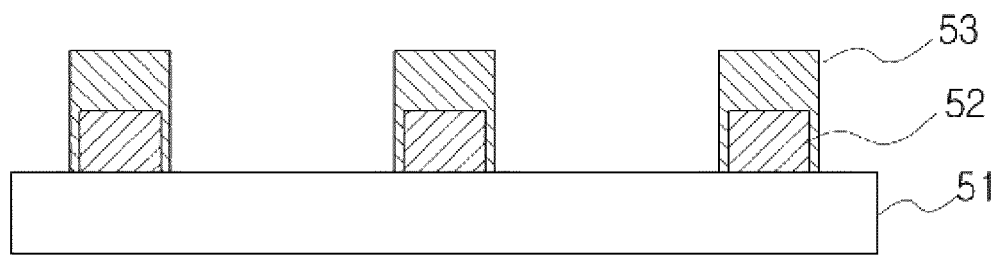
FIG. 5 is a cross-sectional view of metal clad laminate having a low resistance metal pattern according to the present invention.
Figure 6:
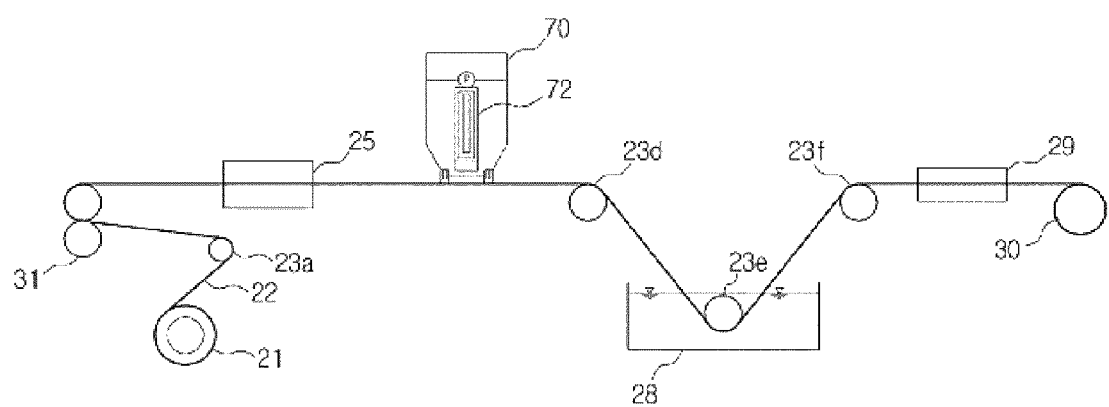
FIG. 6 is a flow chart representing one example of manufacturing method for metal clad laminate having a metal pattern according to the present invention.
Figure 7:
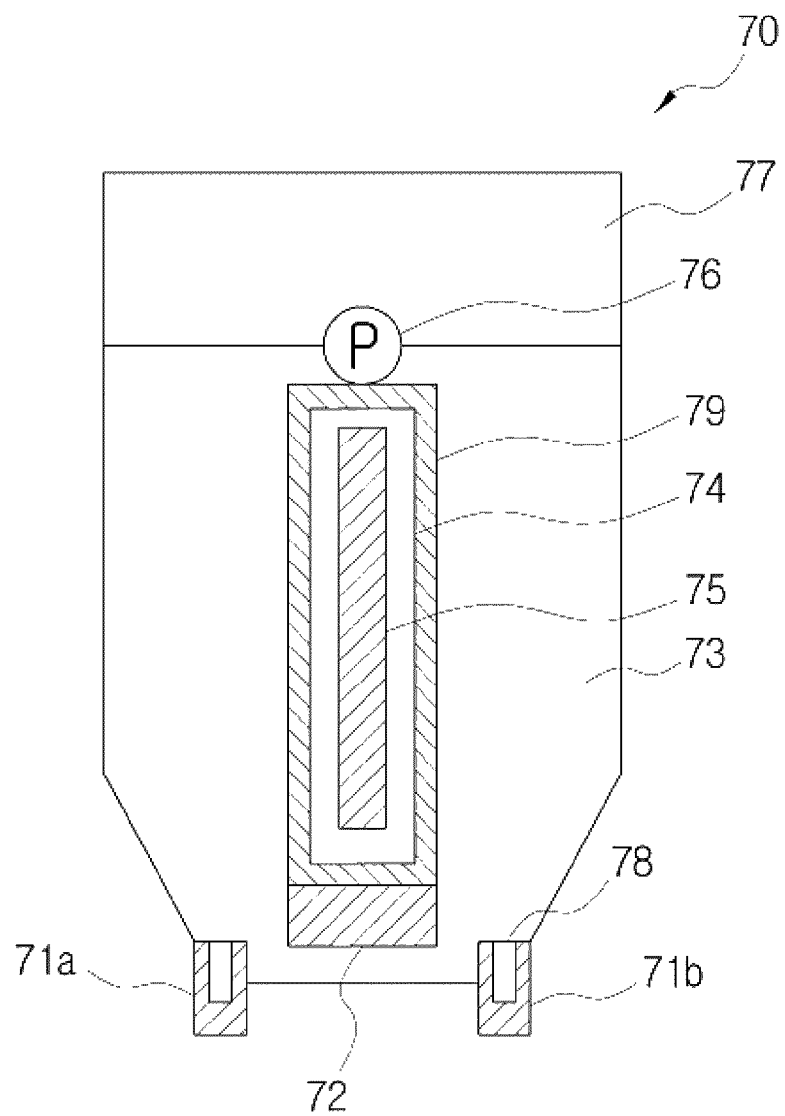
FIG. 7 is a cross-sectional view of plating cartridge for electroplating of the present invention.
Figure 9:
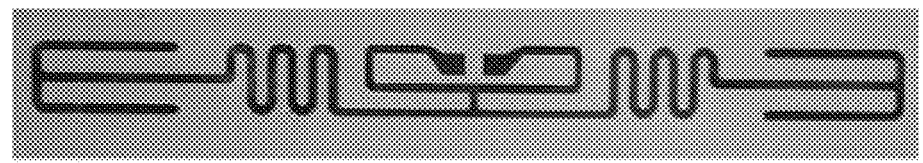
FIG. 9 is a RFID (radio frequency identification) tag antenna prepared according to Example 7 of the present invention.

With the silver coating composition obtained in the Example 5, a pattern of RFID (radio frequency identification) tag antenna was printed using a Gravure printer, wherein said pattern has a sheet resistance of 0.3 Ω/° C. and thickness of 0.2 micron as shown in FIG. 5. Thus-obtained pattern was brought into contact with a plating cartridge for electroplating copper to give a metal pattern having a sheet resistance of 0.01 Ω/° C. Inside the cartridge, an electrolytic solution comprising copper sulfate (180 g/L) was included. An electric current (500 A/m$^2$) was applied while running the system at 7 m/min of the film travel speed to prepare a low-resistance RFID tag antenna pattern to which copper is plated. Photographic image of the resulting pattern is given in FIG. 9.

Example 8 n-Octylammonium n-octylammoniumbicarbonate (3.45 kg, 18.04 mol) and n-butylammonium n-butylbicarbonate (3.19 kg, 50.80 mol) were added to a reactor equipped with a stirrer and isopropanol (0.45 kg) and distilled water (1 kg) were added to dissolve them. Silver oxide (1.6 kg, 7.4 mol) was then added to the reactor and the reaction was carried out at room temperature. The reaction initially occurred in black slurry of said reaction solution. However, according to the formation of a complex over time, it was observed that color of the reaction solution became lighter and eventually turned transparent. After 4 hours of the reaction, a colorless and transparent solution was obtained. To said solution, 1-amino-2-propanol (0.3 kg) and VAP MP 200 (0.15 kg; manufactured by Chokwang Paint, Ltd.), which is an acrylic resin, are added as a stabilizer and a binder resin, respectively. After stirring, the solution was filtered using a membrane filter having a pore size of 0.45 micron to give a silver coating composition with a viscosity of 18 cp. Using thus-obtained silver coating composition, RFID tag antenna with a sheet resistance of 0.4 Ω/° C. and thickness of 0.15 micron was printed onto A PET film by a flexographic printer. Thus-obtained pattern was brought into contact with a plating cartridge for electroplating copper to give a metal pattern having a sheet resistance of 0.01 Ω/° C. Inside the cartridge, an electrolytic solution comprising copper sulfate (180 g/L) was included. An electric current (500 A/m$^2$) was applied while running the system at 7 m/min of the film travel speed to prepare a low-resistance RFID tag antenna pattern to which copper is plated.

INDUSTRIAL APPLICABILITY

As it is explained in the above, the present invention can provide the manufacturing method of metal clad laminates by forming a conductive layer on a single side or both sides of a material that is made of an insulating material using the silver complexes having a unique structure and electroplating metals outside of said conductive layer.

In addition, the present invention can provide the manufacturing method of metal clad laminates, which does not require an expensive apparatus for vaporous deposition and has a fast operation speed for mass production, simple process steps to minimize defective ratio and cheap production cost. Furthermore, the method of the present invention is advantageous in that the adhesiveness of the laminated metal layer to material film is excellent.

Still furthermore, the present invention can provide the metal clad laminates on which a low-resistance metal pattern layer is formed, which is characterized in that a direct printing is carried out onto a material consisting of an insulating material using the silver complex having a unique structure to form a conductive pattern and an electroplating is carried out towards outside of said layer. The low-resistance metal pattern prepared according to said method of the present invention can be applied to various electric and electronic products including RFID tag antenna, metal wiring for flat plate display, and filter for shielding an electric wave, etc.

The invention claimed is:

1. A method of manufacturing a metal clad laminate comprising the steps of: (i) forming a conductive layer on a material by coating a silver coating composition comprising silver complexes which are formed by a reaction between a silver compound of Formula 1, and an ammonium carbamate compound of Formula 2, an ammonium carbonate compound of Formula 3, or an ammonium bicarbonate compound of Formula 4; and (ii) forming a metal-plated layer by electroplating metals on said conductive layer:

$$Ag_nX \qquad \text{[Formula 1]}$$

[Formula 2]

[Formula 3]

-continued

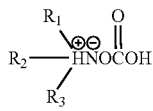
[Formula 4]

in the formula above,

X is a substituted group selected from the group consisting of oxygen, sulfur, halogen, cyano, cyanate, carbonate, nitrate, nitrite, sulfate, phosphate, thiocyanate, chlorate, perchlorate, tetrafluoro borate, acetylacetonate, carboxylate and their derivatives, n is an integer of 1 to 4, $R_1$ to $R_6$ are independently selected from the group consisting of hydrogen, $C_1$-$C_{30}$ aliphatic or cycloaliphatic alkyl, aryl or aralkyl group, a substituted alkyl or aryl group, a heterocyclic compound, a polymer compound, and derivatives thereof, wherein at least one of $R_1$ to $R_6$ is independently selected from $C_1$-$C_{30}$ aliphatic or cycloaliphatic alkyl, aryl or aralkyl group, a substituted alkyl or aryl group, a heterocyclic compound, a polymer compound, and derivatives thereof.

2. The method of claim 1, wherein said silver complexes have the structure of Formula 5:

$$Ag[A]_m \quad \text{[Formula 5]}$$

A is the compound of Formula 2, Formula 3, or Formula 4 as shown in claim 1, and m ranges in 0.7 to 2.5.

3. The method of claim 1, wherein said silver compound is one or more compound selected from the group consisting of silver oxide, silver thiocyanate, silver cyanide, silver cyanate, silver carbonate, silver nitrate, silver nitrite, silver sulfate, silver phosphate, silver perchlorate, silver tetrafluoro borate, silver acetylacetonate, silver carboxylate, silver lactate, silver oxalate and their derivatives.

4. The method of claim 1, wherein $R_1$ to $R_6$ are independently selected from the group consisting of hydrogen, methyl, ethyl, propyl, isopropyl, butyl, isobutyl, amyl, hexyl, ethylhexyl, heptyl, octyl, isooctyl, nonyl, decyl, dodecyl, hexadecyl, octadecyl, docodecyl, cyclopropyl, cyclopentyl, cyclohexyl, allyl, hydroxy, methoxy, hydroxyethyl, methoxyethyl, 2-hydroxy propyl, methoxypropyl, cyanoethyl, ethoxy, buthoxy, hexyloxy, methoxyethoxyethyl, methoxyethoxyethyl, hexamethyleneimine, morpholine, piperidine, piperazine, ethylenediamine, propylenediamine, hexamethylenediamine, triethylenediamine, pyrrol, imidazol, pyridine, carboxymethyl, trimethoxysilylpropyl, triethoxysilylpropyl, phenyl, methoxyphenyl, cyanophenyl, phenoxy, tolyl, benzyl, polyallylamine, polyethyleneimine and their derivatives, wherein at least one of $R_1$ to $R_6$ is independently selected from methyl, ethyl, propyl, isopropyl, butyl, isobutyl, amyl, hexyl, ethylhexyl, heptyl, octyl, isooctyl, nonyl, decyl, dodecyl, hexadecyl, octadecyl, docodecyl, cyclopropyl, cyclopentyl, cyclohexyl, allyl, hydroxy, methoxy, hydroxyethyl, methoxyethyl, 2-hydroxy propyl, methoxypropyl, cyanoethyl, ethoxy, buthoxy, hexyloxy, methoxyethoxyethyl, methoxyethoxyethyl, hexamethyleneimine, morpholine, piperidine, piperazine, ethylenediamine, propylenediamine, hexamethylenediamine, triethylenediamine, pyrrol, imidazol, pyridine, carboxymethyl, trimethoxysilylpropyl, triethoxysilylpropyl, phenyl, methoxyphenyl, cyanophenyl, phenoxy, tolyl, benzyl, polyallylamine, polyethyleneimine, and derivatives thereof.

5. The method of metal clad laminates of claim 1, wherein said ammonium carbamate compound of Formula 2 is one or more compound selected from the group consisting of ethylammonium ethylcarbamate, isopropylammonium isopropylcarbamate, n-butylammonium n-butylcarbamate, isobutylammonium isobutylcarbamate, t-butylammonium t-butylcarbamate, 2-ethylhexylammonium 2-ethylhexylcarbamate, octadecylammonium octadecylcarbamate, 2-methoxyethylammonium 2-methoxyethylcarbamate, 2-cyanoethylammonium 2-cyanoethylcarbamate, dibutylammonium dibutylcarbamate, dioctadecylammonium dioctadecylcarbamate, methyldecylammonium methyldecylcarbamate, hexamethyleneimineammonium hexamethyleneiminecarbamate, morpholinium morpholinecarbamate, pyridinium ethylhexylcarbamate, triethylenediaminium isopropylbicarbamate, benzylammonium benzylcarbamate, triethoxysilylpropylammonium triethoxysilylpropylcarbamate and their derivatives; said ammonium carbonate compound of Formula 3 is one or more compound selected from the group consisting of ethylammonium ethylcarbonate, isopropylammonium isopropylcarbonate, n-butylammonium n-butylcarbonate, isobutylammonium isobutylcarbonate, t-butylammonium t-butylcarbonate, 2-ethylhexylammonium 2-ethylhexylcarbonate, 2-methoxyethylammonium 2-methoxyethylcarbonate, 2-cyanoethylammonium 2-cyanoethylcarbonate, octadecylammonium octadecylcarbonate, dibutylammonium dibutylcarbonate, dioctadecylammonium dioctadecylcarbonate, methyldecylammonium methyldecylcarbonate, hexamethyleneimineammonium hexamethyleneiminecarbonate, morpholineammonium morpholinecarbonate, benzylammonium benzylcarbonate, triethoxysilylpropylammonium triethoxysilylpropylcarbonate, triethylenediaminium isopropylcarbonate and their derivatives; and said ammonium bicarbonate compound of Formula 4 is one or more compound selected from the group consisting of isopropylammonium bicarbonate, t-butylammonium bicarbonate, 2-ethylhexylammonium bicarbonate, 2-methoxyethylammonium bicarbonate, 2-cyanoethylammonium bicarbonate, dioctadecylammonium bicarbonate, pyridinium bicarbonate, triethylenediaminium bicarbonate and their derivatives.

6. The method of claim 1, wherein the silver coating composition further comprises an additive selected from solvents, stabilizers, leveling agents or film assistants.

7. The method of claim 6, wherein said solvents are one or more compounds selected from the group consisting of water, alcohol, glycol, acetate, ether, ketone, aliphatic hydrocarbon, aromatic hydrocarbon and halogen substituted hydrocarbon solvent.

8. The method of claim 6, wherein said solvents are one or more compounds selected from the group consisting of water, methanol, ethanol, isopropanol, butanol, ethyleneglycol, glycerine, ethyl acetate, butyl acetate, carbitol acetate, diethyl ether, tetrahydrofuran, dioxane, methyl ethyl ketone, acetone, hexane, heptane, benzene, toluene, chloroform, methylene chloride, carbontetrachloride and mixed solvents of the above.

9. The method of claim 6, wherein said stabilizers are more than one selected from the group consisting of amine compounds, ammonium carbamate compounds of Formula 2, ammonium carbonate compounds of Formula 3, ammonium bicarbonate compounds of Formula 4, phosphorus compounds and sulfur compounds:

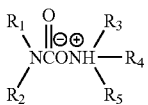
[Formula 2]

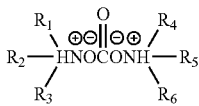
[Formula 3]

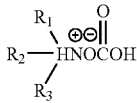
[Formula 4]

In the formula above,

R$_1$ to R$_6$ are independently selected from the group consisting of hydrogen, C$_1$-C$_{30}$ aliphatic or cycloaliphatic alkyl, aryl or aralkyl group, a substituted alkyl or aryl group, a heterocyclic compound, a polymer compound and derivatives thereof, wherein at least one of R$_1$ to R$_6$ is independently selected from C$_1$-C$_{30}$ aliphatic or cycloaliphatic alkyl, aryl or aralkyl group, a substituted alkyl or aryl group, a heterocyclic compound, a polymer compound, and derivatives thereof.

10. The method of claim 9, wherein phosphorus compounds are selected from compounds represented by Formula 6, Formula 7 or Formula 8:

 R$_3$P  [Formula 6]

 (RO)$_3$P  [Formula 7]

 (RO)$_3$PO  [Formula 8]

In the formula above, R is a substituted group selected from alkyl or aryl group of carbon number 1 to 20.

11. The method of claim 9, wherein sulfur compounds are selected from the group consisting of butan thiol, n-hexanethiol, diethyl sulfide, alkylmercaptoacetate, mercaptobenzothiazole and tetrahydrothiophene.

12. The manufacturing method of metal clad laminates of claim 6, wherein film assistants are more than one selected from the group consisting of organic acid, organic acid ammonium salt and organic acid metal salt.

13. The method of claim 1, wherein said material is selected from the group consisting of polyimide (PI), polyethyleneterephthalate (PET), polyethylenenaphthalate (PEN), polyethersulfone (PES), nylon, polytetrafluoroethylene (PTFE), polyetheretherketone (PEEK), polycarbonate (PC) or polyarylate (PA).

14. The method of claim 1, wherein the coating is performed by brushing, spray coating, dip coating, roll coating, spin coating, inkjet printing, offset printing, screen printing, pad printing, Gravure printing, Flexo printing, Imprinting or Riso printing.

15. The method of claim 1, wherein said silver coating composition further comprises binder resins to improve adhesive power between silver coating composition and the materials.

16. The method of claim 15, wherein said binder resins are more than one selected from the group consisting of acrylic resins, cellulose resins, polyester, vinyl resins, polyamide, polyurethane, polyether, urea resins, alkyd resins, silicone resins, fluoride resins, polyolefin, petroleum resins, rosin, epoxy resins, unsaturated polyester, diallylphthalate resins, phenol resins, oxetane resins, oxazine resins, bismaleimide resins, modified silicone resins, melamine resin, rubber, natural polymer, glass resins and glass frit.

17. The method of claim 1, further comprising an after-treatment process, which is selected from oxidation treatment, reduction treatment, heat treatment, infrared ray, ultraviolet, electronic ray or laser, after formation of a conductive layer by coating the silver coating composition.

18. The method of claim 17, wherein said after-treatment process is done in air, nitrogen, argon, carbon monoxide, hydrogen or their mixed gas condition.

19. The method of claim 1, wherein the thickness and the conductivity of a conductive layer are 0.005 to 5 μm and 10 mΩ to 1 kΩ/° C., respectively.

20. The method of claim 1, wherein the thickness of a metal-plated layer is 1 to 50 μm.

21. The method of claim 1, wherein the material for a metal-plated layer is more than one selected from the group consisting of copper, aluminum, nickel, silver, gold, chrome or alloys of these.

22. The method of claim 1, wherein the conductive layer is a conductive pattern layer formed by printing the silver coating composition directly on the materials.

23. The method of claim 22, wherein said printing method is selected from the group consisting of inkjet printing, offset printing, screen printing, pad printing, Gravure printing, Flexo printing, Imprinting or Riso printing.

24. The method of claim 22, wherein the electroplating is performed by a plating cartridge comprising a cathode which contacts the conductive pattern layer and an anode placed inside of the plating cartridge.

25. The method of claim 24, wherein said plating cartridge comprises an insulating sponge which can support an electroplating solution and said sponge contacts the anode and the cathode.

26. The method of claim 25, wherein an oscillator is comprised inside of said plating cartridge for contacting the electroplating solution to the cathode of the conductive pattern.

27. Metal clad laminates prepared by the manufacturing method of claim 1.

28. Metal clad laminates prepared by the manufacturing method of claim 22.

* * * * *